United States Patent [19]

Gallani et al.

[11] 4,066,983
[45] Jan. 3, 1978

[54] VOLTAGE CONTROLLED CLAPP OSCILLATOR HAVING OUTPUT ISOLATED FROM TUNED CIRCUIT

[75] Inventors: Zvi Gallani, Bedford; Joseph A. Sullivan, Tewksbury, both of Mass.

[73] Assignee: Raytheon Company, Lexington, Mass.

[21] Appl. No.: 746,775

[22] Filed: Dec. 2, 1976

[51] Int. Cl.² ............................................. H03B 5/12
[52] U.S. Cl. ............................. 331/117 R; 331/117 V
[58] Field of Search ............... 331/117 R, 36 C, 177 V

[56] References Cited
U.S. PATENT DOCUMENTS

| 2,930,002 | 3/1960 | Edwards et al. | 331/117 R X |
| 3,397,365 | 8/1968 | Kruse, Jr. et al. | 331/177 V X |
| 3,813,615 | 5/1974 | Okazaki | 331/117 R X |
| 3,855,553 | 12/1974 | Cronin | 331/117 R |

OTHER PUBLICATIONS

Draper, "Recent Developments in Solid State Sources for Microwave Instrumentation", Electronic Engineering, Jan. 1974, pp. 54–58.

*Primary Examiner*—Siegfried H. Grimm
*Attorney, Agent, or Firm*—Philip J. McFarland; Joseph D. Pannone

[57] ABSTRACT

A voltage controlled oscillator arrangement having improved characteristics is shown to include a Clapp type oscillator utilizing a transistor as the active element, the electrodes of such transistor being connected to an electronically tunable resonant circuit and to a load in such a fashion as to effectively separate the two.

2 Claims, 1 Drawing Figure

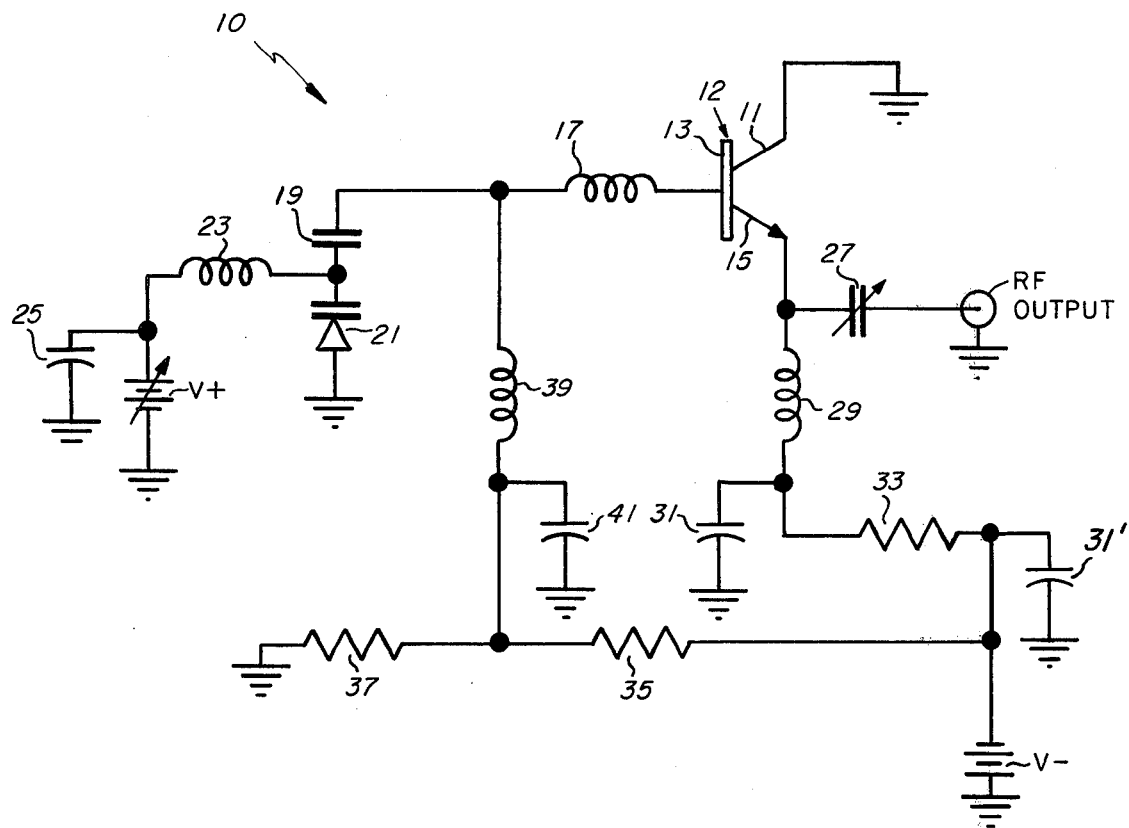

VOLTAGE CONTROLLED CLAPP OSCILLATOR HAVING OUTPUT ISOLATED FROM TUNED CIRCUIT

The invention herein described was made in the course of or under a contract or subcontract thereunder, with the Department of Defense.

BACKGROUND OF THE INVENTION

This invention relates generally to voltage controlled oscillators and more particularly to a voltage controlled oscillator wherein the output circuit is isolated from the tuning circuit.

The use of a varactor having a voltage dependent variable capacitance for tuning resonant circuits is well known in the art. Thus, the level of a bias voltage applied to a varactor in the resonant circuit of an oscillator, such as the well known Clapp oscillator, may be changed to control the frequency of the output of the oscillator. Generally, the output of a Clapp oscillator is taken across a portion of the resonant circuit and, in consequence, output power varies as a function of frequency. If the output power is to be constant as the frequency is changed, a feedback technique such as the technique described in U.S. Pat. Nos. 3,370,254, 3,723,906 or 3,899,755 may be utilized. Although either cited technique is quite effective in providing a tunable oscillator having a relatively constant power output, other considerations of equal importance (such as FM noise generated by the oscillator and the effect of transients on the oscillator) are not addressed by either technique.

If very low FM noise level is to be achieved in the operation of a Clapp oscillator, the Q of the combination of the resonant circuit of the oscillator and a load should be as high as possible. With the load connected directly to the resonant circuit, the Q is limited by the load to such a degree in any practical arrangement that a significant level of FM noise must be tolerated. Further, in the standard Clapp oscillator, any mismatch between the load and the oscillator will result in the phenomenon known as "frequency pulling" or detuning of the oscillator.

The settling time and post tuning drift of an oscillator of the type here being considered is determined primarily by the amount of power dissipated in the varactor used for tuning. In the standard Clapp oscillator the varactor in the resonant circuit is also part of the output circuit. This means that the amount of power dissipated by the varactor will be dependent on the power output of the oscillator. It follows, then, that satisfactory performance of the standard Clapp oscillator may be achieved only at low power levels.

SUMMARY OF THE INVENTION

With this background of the invention in mind, it is an object of this invention to provide an improved voltage controlled oscillator operable in the presence of transients.

It is another object of this invention to provide an improved voltage controlled oscillator having very low FM noise.

A still further object of this invention is to provide an improved voltage controlled oscillator having a uniform output power over its tuning range.

These and other objects of the invention are generally attained by providing a voltage controlled oscillator using a transistor operating in a common base, grounded collector configuration wherein the resonant circuit is effectively separated from the output circuit. The resonant circuit comprises a varactor connected in series with a fixed capacitor, an inductor, and the collector-to-base capacitance of the transistor. The output circuit is connected across the emitter and the collector of the transistor and is provided with a variable capacitor for matching purposes.

BRIEF DESCRIPTION OF THE DRAWING

The foregoing features of this invention, as well as the invention itself, may be more fully understood from the following detailed description read together with the accompanying drawing, the single FIGURE of which is a schematic representation of an oscillator in accordance with the invention. Description of the Preferred Embodiment Referring now to the FIGURE, a voltage controlled oscillator 10 (hereinafter referred to simply as oscillator 10) is shown to comprise an NPN transistor 12 having a first (or collector) electrode 11, a second (or base) electrode 13, and a third (or emitter) electrode 15. Collector electrode 11 is connected, as shown, directly to ground. Base electrode 13 has connected in series therewith a coil 17, a fixed capacitor 19 and a varactor 21, here a diode. Varactor 21 has its anode electrode (not numbered) connected to ground, as shown, and its cathode electrode (also not numbered) connected, through a choke 23, to a by-pass capacitor 25 and to a variable source of positive biasing potential, V+. The resonant circuit for oscillator 10 comprises varactor 21, fixed capacitor 19, coil 17 and the collector-to-base capacitance of the NPN transistor 12. It will be appreciated that the capacitance of the varactor 21 may be changed by changing the level of the positive biasing potential V+ in any convenient manner. Because the way in which the level of the positive biasing potential V+ is adjusted is not an essential part of this invention and because the invention may be understood without illustrating such a detail, no showing of any particular way of changing the level of the positive biasing potential V+ is here made. Choke 23 and capacitor 25 serve to isolate the RF energy in the resonant circuit of oscillator 10 from the positive biasing potential V+. Capacitor 19 serves to block the positive biasing potential V+ from appearing at the base electrode 13.

The required feedback for oscillator 10 is provided through the emitter-to-collector capacitance of the NPN transistor 12. As may be seen, the RF output signal from oscillator 10 is obtained from the feedback network thereby requiring the use of a capacitor 27 to match the relatively low impedance of the emitter-to-collector junction of the NPN transistor 12 to a load, here taken to be a 50 ohm transmission line (not numbered, but labeled "RF OUTPUT"). Capacitor 27 is here a mechanically tunable variable capacitor, although once the optimum value of capacitor 27 is ascertained, the variable capacitor could be replaced by a fixed capacitor.

Emitter electrode 15 is connected, via a choke 29, to a by-pass capacitor 31, and, via the choke 29, resistor 33 and by-pass capacitor 31', to a source of negative biasing potential V−. The base electrode 13 is connected to the negative biasing potential V− via a choke 39 and a voltage comprising resistors 35 and 37. A by-pass capacitor 41 is connected as shown. The RF energy in the resonant circuit of oscillator 10 is, therefore, isolated from the negative biasing potential V−.

In the just described arrangement, the output circuit is effectively separated from the resonant circuit of the oscillator 10. A penalty, meaning a loss in overall efficiency, is incurred as a result of the mismatch loss of capacitor 27. However, because the resonant circuit is effectively separated from the output circuit, tuning of the resonant circuit has a negligible effect on the output circuit. A very uniform power output over the oscillator frequency range results without the necessity of external feedback networks. Furthermore, the effective separation of the resonant circuit from the output circuit results in an oscillator having very low FM noise. Such a low FM noise response is not possible in the standard Clapp oscillator because the load resistance is actually a part of the resonant circuit. Another advantage realized by separating the resonant circuit from the output circuit is a reduction in the oscillator settling time response and post tuning drift. It has been found that the oscillator settling time and post tuning drift is dependent to a great extent on the power dissipated in the varactor. In the standard Clapp oscillator (because the varactor is part of the output circuit) the load current passes through the varactor and, therefore, the settling time and post tuning drift is dependent on the oscillator output power. Removing the varactor from the output circuit limits the amount of current through the varactor and, therefore, results in an oscillator having good transient performance.

The oscillator 10 has been built and found effective in providing a total output power variation of 0.3 dB over a 15 percent tuning bandwidth. A table of values for the circuit elements used in the design of an S-band oscillator is given below.

NPN transistor 12: Microwave Semiconductor Corp. 80019
resistor 33: 10 ohms
resistor 35: 150 ohms
resistor 37: 1K ohm
capacitor 19: 3.9 pf
capacitors 25, 31, 41, 31': 1500 pf
capacitor 27: Johanson 9410-2
varactor 21: Varian VAT 13N18 diode
coils 23, 29, 39: 4 turns #20 wire 0.080 I. D., 0.100 long
coil 17: 1¼ turns #20 wire 0.080 I. D., 0.100 long Having described a preferred embodiment of this invention, it is now evident that other embodiments incorporating its concepts may be used. For example, both a coarse and fine tuning varactor could be used in place of the single tuning varactor shown. It is felt, therefore, that this invention should not be restricted to its disclosed embodiment, but rather should be limited only by the spirit and scope of the appended claims.

What is claimed is:
1. A voltage tunable oscillator comprising:
 a. a transistor having first, second and third electrodes, said first electrode being grounded;
 b. means connected to said second electrode and comprising an inductor, a capacitor and a varactor to form a resonant circuit across the interelectrode capacitance between said first and said second electrodes;
 c. a feedback circuit comprising the interelectrode capacitance between said first and third electrodes;
 d. an output circuit connected to said third electrode and including a variable capacitor for matching the impedance of said output circuit; and
 e. means for biasing said second and third electrodes and for controlling the capacitance of the varactor thereby to control the frequency of operation.
2. A voltage tunable oscillator as in claim 1 wherein said first, second and third electrodes of said transistor comprise collector, base and emitter electrodes respectively.